(12) United States Patent
Lin

(10) Patent No.: US 6,316,718 B1
(45) Date of Patent: Nov. 13, 2001

(54) ELECTRIC POWER SUPPLY DEVICE HAVING DETACHABLE FAN DEVICE

(76) Inventor: Ching Shyong Lin, 6F, No. 440-2, Gin Pin Road, Chong Ho City, Taipei Hsien (TW), 235

( * ) Notice: Subject to any disclaimer, the term of this patent is extended or adjusted under 35 U.S.C. 154(b) by 0 days.

(21) Appl. No.: 09/641,604

(22) Filed: Aug. 15, 2000

(51) Int. Cl.[7] ............................... H05K 5/06; H05K 7/20
(52) U.S. Cl. ........................................ 174/17 VA; 361/695
(58) Field of Search ............................... 174/17 VA, 52.1, 174/35 R, 16.1, 35 GC; 361/685, 695, 680, 687, 384, 681

(56) References Cited

U.S. PATENT DOCUMENTS

| | | | |
|---|---|---|---|
| 5,562,410 | * 10/1996 | Sachs et al. | 415/213.1 |
| 6,075,698 | * 6/2000 | Hogan et al. | 361/695 |
| 6,185,098 | * 2/2001 | Benavides | 361/695 |

* cited by examiner

*Primary Examiner*—Rajnikant B. Patel

(57) ABSTRACT

An electric power supply device includes a cover secured on top of a housing. One or more fan members and nets are secured to a casing which has one or more openings aligned with the fan members. The casing is detachably secured to the housing for disengaging and fixing or replacing the fan members. One or more plates are secured to the casing for disposing switches and sockets. A handle is pivotally secured to the casing for carrying the casing and the fan members. One or more electric power supply devices may be received in a receptacle and coupled between electrical facilities.

1 Claim, 3 Drawing Sheets

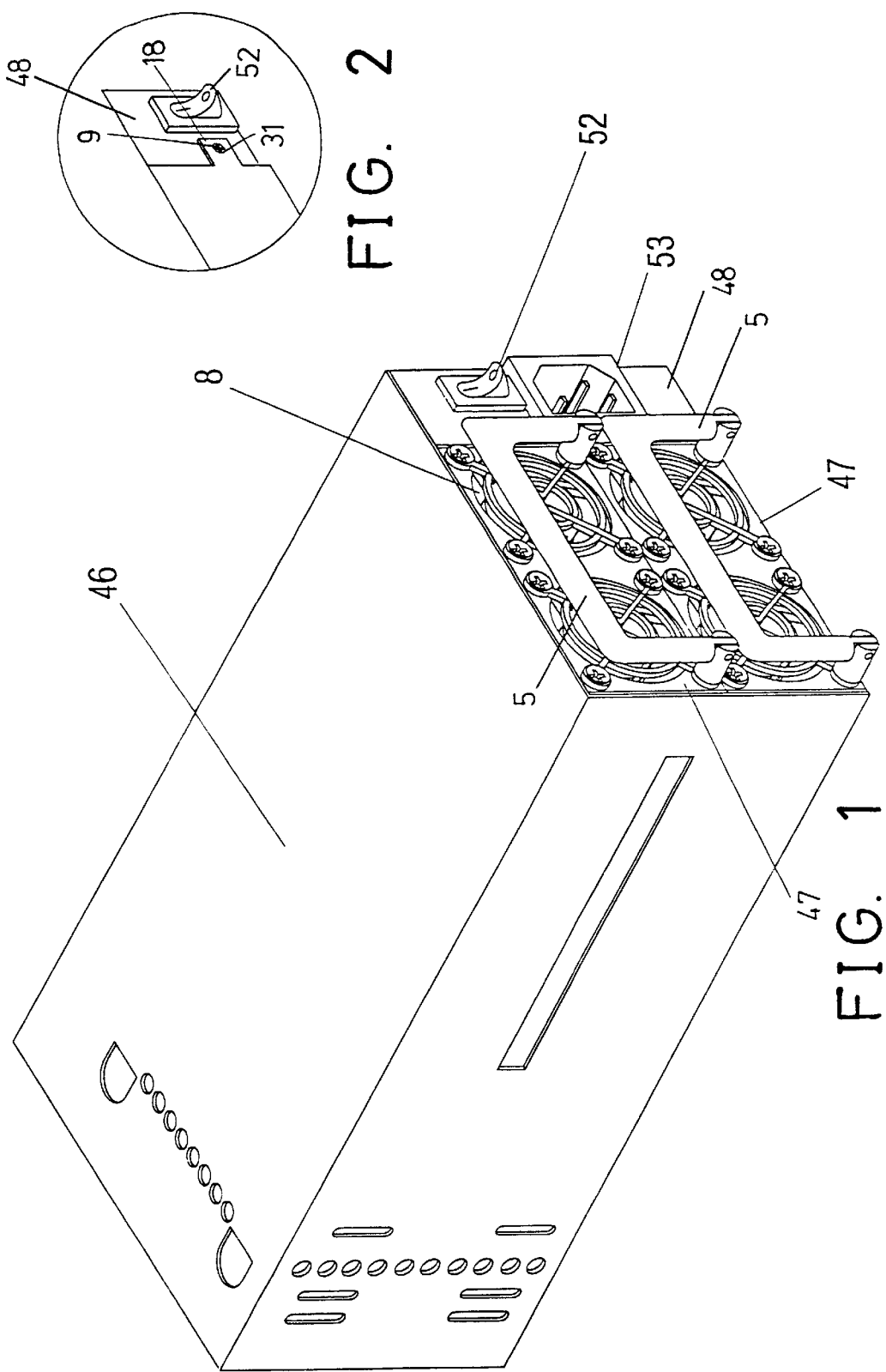

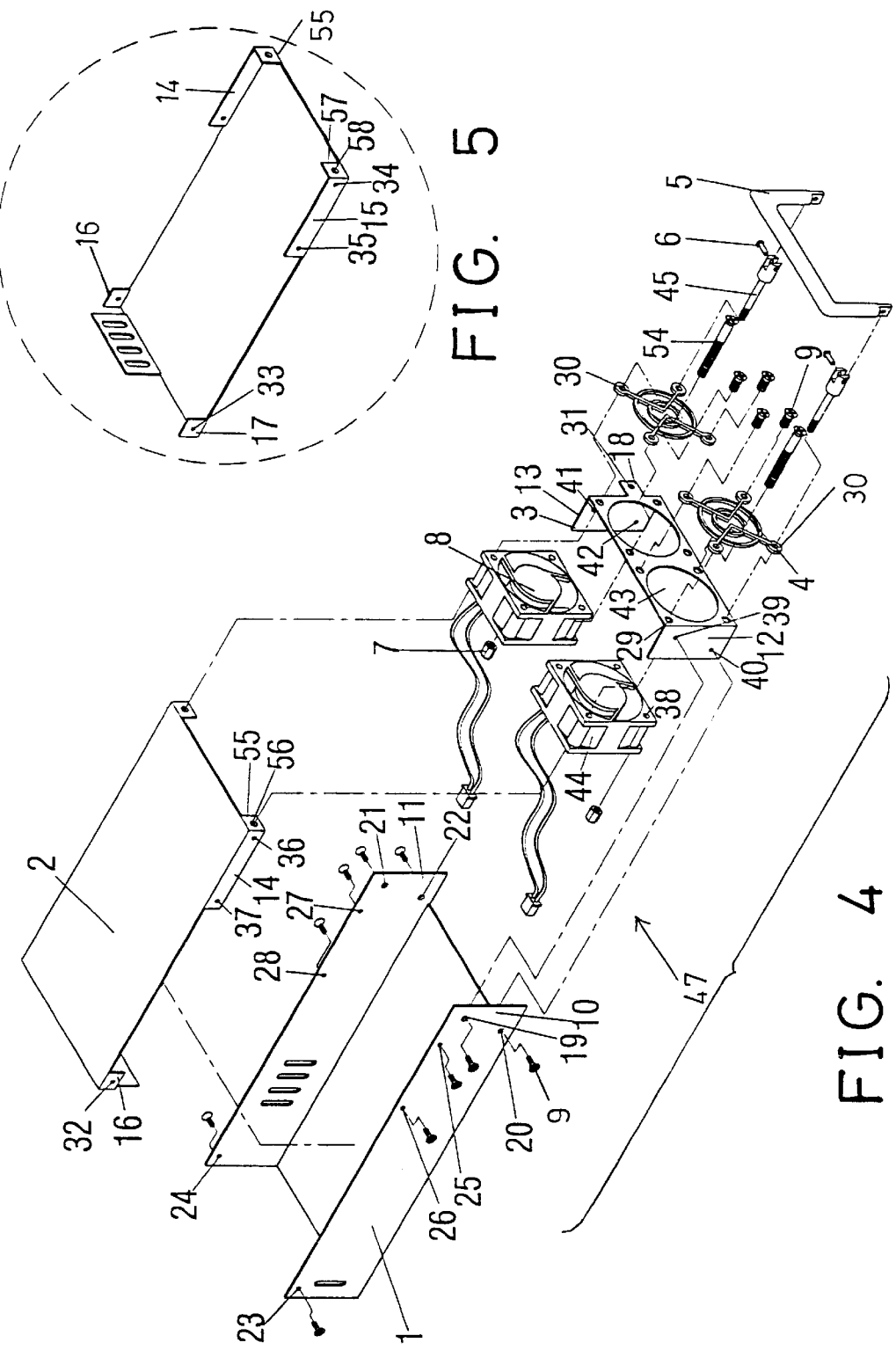

ELECTRIC POWER SUPPLY DEVICE HAVING DETACHABLE FAN DEVICE

BACKGROUND OF THE INVENTION

1. Field of the Invention

The present invention relates to an electric power supply device, and more particularly to an electric power supply device having a fan device that may be detached and that may be easily fixed or replaced with the other ones.

2. Description of the Prior Art

Typical electric power supply devices comprise one or more plugs and sockets provided therein and coupled to or between various electrical facilities, and/or comprise an electric circuit provided there in for stabilizing the electric power and for providing a stabilized electric power to the electrical facilities. The electric power supply devices may generate heat during operation, such that one or more fan devices are required to be provided and attached to each of the electric power supply devices for dissipating the heat that may be generated by the electric power supply device. However, the fan devices are fixed in the electric power supply device and may not be detached or disengaged from the electric power supply device, such that the fan device may not be easily fixed or replaced with the other one when the fan device is damaged or the like.

The present invention has arisen to mitigate and/or obviate the afore-described disadvantages of the conventional electric power supply devices.

SUMMARY OF THE INVENTION

The primary objective of the present invention is to provide an electric power supply device including a fan device that may be detached and that may be easily fixed or replaced with the other ones.

In accordance with one aspect of the invention, there is provided an electric power supply device comprising a housing including a front portion and an upper portion, a cover secured to the upper portion of the housing, a casing including at least one opening formed therein and including a front portion, at least one fan member secured to the casing and aligned with the opening of the casing, at least one net secured to the front portion of the casing for blocking the opening of the casing, and means for detachably securing the casing and thus the fan member to the cover and the housing. One or more electric power supply devices may be received in a receptacle and coupled between the electrical facilities.

The housing includes two side walls each having an upper front portion and an upper rear portion, the cover includes two flanges secured to the upper front portions of the side walls and includes two ears secured to the upper rear portions of the housing. The side walls each includes a front portion, the casing includes two side panels secured to the front portions of the side walls respectively.

The cover includes at least one front ear provided thereon, and at least one fastener is engaged with the casing and the front ear of the cover for detachably securing the casing and thus the fan member to the cover and the housing.

The fan member includes at least one cavity formed therein, the detachably securing means includes at least one lock nut received in the cavity of the fan member, and at least one fastener engaged through the net and the casing and the fan member and threaded with the lock nut for detachably securing the casing and thus the fan member to the cover and the housing.

The casing includes an extension extended therefrom, the electric power supply device further includes a plate, and means for securing the plate to the extension of the casing. The plate includes a switch and/or a socket provided thereon.

A handle is further pivotally secured to the casing. The detachably securing means includes two fasteners secured to the casing, the handle is pivotally secured to the fasteners with pivot pins.

Further objectives and advantages of the present invention will become apparent from a careful reading of a detailed description provided hereinbelow, with appropriate reference to accompanying drawings.

BRIEF DESCRIPTION OF THE DRAWINGS

FIG. 1 is a perspective view of a receptacle having two electric power supply devices in accordance with the present invention received in the receptacle;

FIG. 2 is a partial perspective view showing a coupling portion of the electric power supply device to the receptacle;

FIG. 4 is an exploded view of the electric power supply device; and

FIG. 5 is a bottom perspective view illustrating the cover of the electric power supply device.

DETAILED DESCRIPTION OF THE PREFERRED EMBODIMENT

Figure 3:
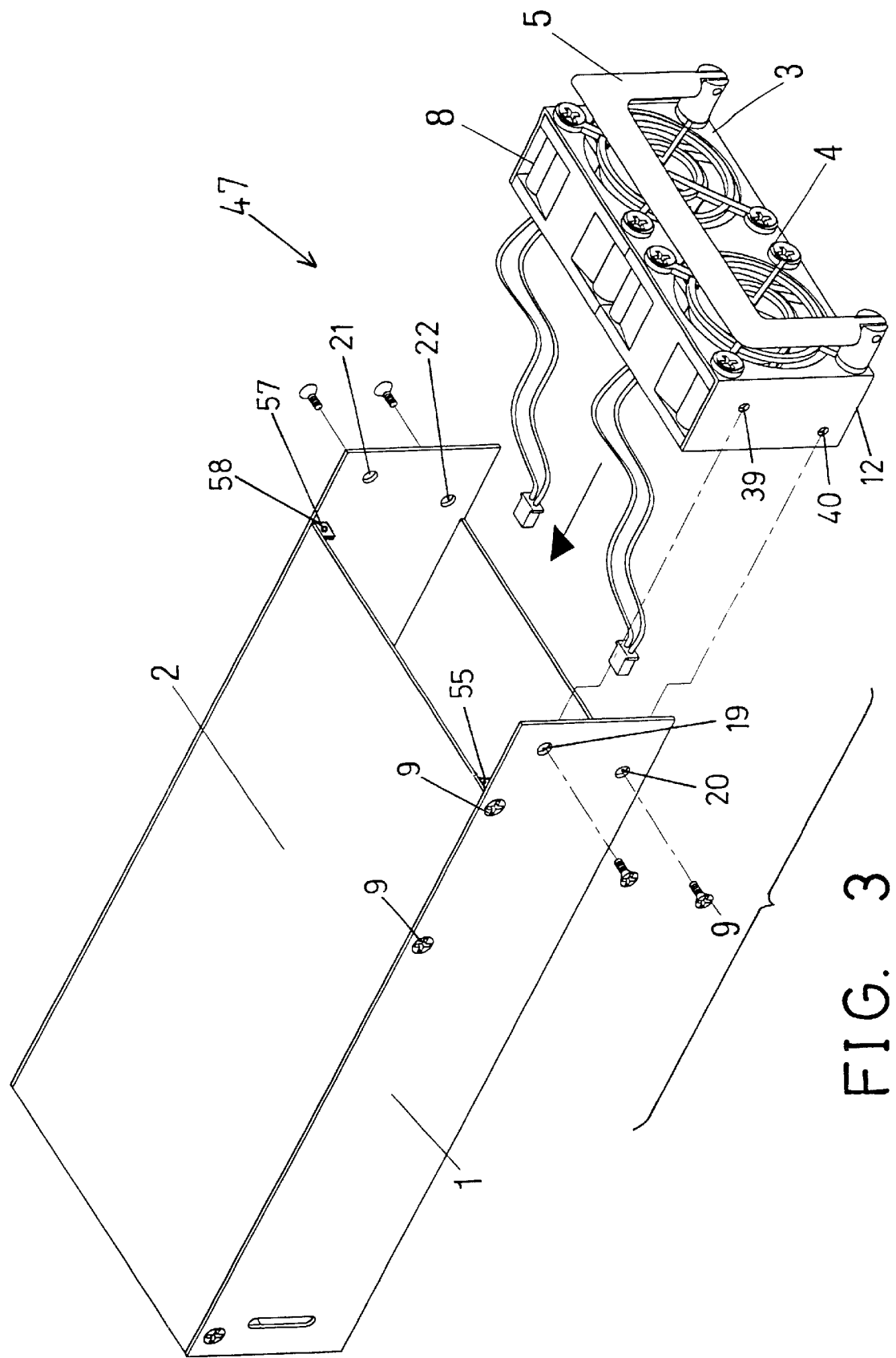
FIG. 3 is a partial exploded view of the electric power supply device.

Referring to the drawings, and initially to FIG. 1, illustrated is a receptacle 46 that may be provided for receiving one or more electric power supply devices in accordance with the present invention. For example, two electric power supply devices 47 are shown and received in the receptacle 46.

Referring next to FIGS. 3–5, the electric power supply devices 47 each comprises a housing 1 including two side walls 10, 11, and a cover 2 to be secured between the upper portions of the side walls 10, 11. The side walls 10, 11 each includes a front portion having one or more holes 19, 20; and 21, 22 formed therein for receiving fasteners 9; and each includes a front upper portion having one or more holes 25, 26; and 27, 28 formed therein for receiving fasteners 9; and each includes a rear upper portion having one or more holes 23, 24 formed therein for receiving fasteners 9. The cover 2 includes two flanges 14, 15 dependent downward from the front portion thereof and each having one or more holes 36, 37; and 34, 35 formed therein and aligned with the respective holes 25, 26; and 27, 28 of the housing 1 and for receiving the fasteners 9 which may be used for securing the cover 2 to the housing 1. The cover 2 includes two ears 16, 17 dependent downward from the rear and side portions thereof and each having one or more holes 32, 33 formed therein and aligned with the respective holes 23, 24 of the housing 1 and for receiving the fasteners 9 which may also be used for securing the cover 2 to the housing 1. The cover 2 further includes two ears 55, 57 dependent downward from the front portion thereof and each having one or more holes 56, 58 formed therein.

The electric power supply device 47 includes a fan device attached and secured to the front portion of the housing 1 and each having a casing 3 for receiving one or more fan members 8 therein.

The casing 3 includes two side panels 12, 13 each having one or more holes 39, 40; and 41, 42 formed therein and aligned with the respective holes 19, 20; and 21, 22 of the housing 1 and for receiving the fasteners 9 which may be used for securing the casing 3 to the housing 1.

The casing 3 includes one or more openings 43 formed therein and communicating with the respective fan members 8 for allowing the air to flow into the respective fan members 8. The casing 3 includes one or more holes 29 formed in the front portion thereof. The fan members 8 each includes one or more holes 38 formed therein and aligned with the respective holes 29 of the casing 3 and each includes one or more cavities 44 formed therein and communicating with the holes 38 thereof for receiving lock nuts 7 respectively.

One or more nets 4 are further provided and to be attached onto the front portion of the casing 3 and disposed in front of the respective openings 43 of the casing 3 for blocking and shielding the openings 43 of the casing 3 and thus the fan members 8 respectively. The nets 4 each includes one or more holes 30 formed therein for receiving fasteners 9, 45, 54 respectively which may secure the nets 4 and the casing 3 and the fan members 8 together. For example, two of the fasteners 45 are engaged through the holes 30 of the two nets 4 and the holes 29 of the casing 3 and the holes 38 of the fan members 8 and engaged or threaded with the screw holes or holes 56, 58 of the ears 55, 57 of the cover 3, and may be threaded with the lock nuts 7, so as to secure the nets 4 and the casing 3 and the fan members 8 together and so as to secure the fan device to the cover 3 and the housing 1. The other two fasteners 54 are engaged through the other holes 30 of the two nets 4 and the other holes 29 of the casing 3 and the other holes 38 of the fan members 8 and are threaded with the lock nuts 7 for further solidly securing the nets 4 and the casing 3 and the fan members 8 together.

The electric power supply device 47 further includes a handle 5 attached thereto, for example, pivotally secured to the fasteners 45 with one or more pivot pins 6 such that the handle 5 may be rotated relative to the casing 3 about the pivot pins 6. The handle 5 may be used for carrying the casing 3 and the fan members 8. As shown in FIGS. 1, 2 and 4, the casing 3 of the electric power supply device 47 includes an extension 18 extended therefrom and having a hole 31 formed therein for receiving the fastener 9 which may secure a plate 48 to the electric power supply device 47. For example, the plate 48 may be secured to the receptacle 46 with fasteners, and the casings 3 of the electric power supply device 47 may be secured to the plate 48 of the receptacle 46 with the extension 18 and the fasteners 9. One or more switches 52 and sockets 53 may be attached to the plate 48 for coupling to the other electrical facilities. Alternatively, the electric power supply devices 47 may each includes a plate 48 secured to the casing 3 for attaching or holding the switch(es) 52 and the socket(s) 53 in the plate(s) 48.

In operation, as shown in FIG. 3, the cover 2 may be secured to the housing 1. The nets 4 and the casing 3 and the fan members 8 may be secured together with the fasteners 45 and 9, and may then be secured to the cover 2 and thus the housing 1 with the fasteners 54 and/or the lock nuts 7. The fan members 8 may thus be easily disengaged from the cover 2 and the housing 1 by unthreading the fasteners 54 relative to the cover 2. The fan members 8 may thus be easily cleaned or fixed or replaced with the other ones when the casing 3 and thus the fan members 8 are disengaged from the cover 2 and the housing 1.

Accordingly, the electric power supply device in accordance with the present invention includes a fan device that may be detached and that may be easily fixed or replaced with the other ones.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

I claim:

1. An electric power supply device comprising:

a housing including a front portion and an upper portion, said housing including two side walls each having an upper front portion and an upper rear portion, said side walls of said housing each including a front portion, a cover secured to said upper portion of said housing, said cover including two flanges secured to said upper front portions of said side walls and including two ears secured to said upper rear portions of said housing, said cover including at least one front ear provided thereon, a casing including at least one opening formed therein and including a front portion, said casing including two side panels secured to said front portions of said side walls of said housing respectively, said casing including an extension extended therefrom, at least one fan member secured to said casing and aligned with said at least one opening of said casing, said at least one fan member including at least one cavity formed therein, at least one net secured to said front portion of said casing for blocking said at least one opening of said casing, at least one lock nut received in said at least one cavity of said at least one fan member, at least one first fastener engaged through said at least one net and said casing and said at least one fan member and threaded with said at least one lock nut for detachably securing said casing and thus said at least one fan member to said cover and said housing, and at least one second fastener engaged with said casing and said at least one front ear of said cover for detachably securing said casing and thus said at least one fan member to said cover and said housing.

* * * * *